United States Patent
Misdom et al.

(10) Patent No.: US 12,120,792 B2
(45) Date of Patent: Oct. 15, 2024

(54) CURRENT TRANSFORMER WITH BYPASS FOR USE IN A SURGE DETECTOR

(71) Applicant: SIGNIFY HOLDING B.V., Eindhoven (NL)

(72) Inventors: Johannes Adrianus Cornelis Misdom, Weert (NL); Jop Van Laanen, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/922,361

(22) PCT Filed: May 6, 2021

(86) PCT No.: PCT/EP2021/061953
§ 371 (c)(1),
(2) Date: Oct. 29, 2022

(87) PCT Pub. No.: WO2021/228669
PCT Pub. Date: Nov. 18, 2021

(65) Prior Publication Data
US 2023/0180366 A1 Jun. 8, 2023

(30) Foreign Application Priority Data
May 12, 2020 (EP) .................... 20174133

(51) Int. Cl.
*H05B 45/50* (2022.01)
*G01R 19/165* (2006.01)
*H01F 27/28* (2006.01)

(52) U.S. Cl.
CPC ....... *H05B 45/50* (2020.01); *G01R 19/16538* (2013.01); *H01F 27/28* (2013.01)

(58) Field of Classification Search
None
See application file for complete search history.

(56) References Cited

U.S. PATENT DOCUMENTS

| 2,248,623 | A |   | 7/1941  | Hand     |            |
|-----------|---|---|---------|----------|------------|
| 4,301,491 | A |   | 11/1981 | Gryctko  |            |
| 5,854,730 | A | * | 12/1998 | Mitchell | H02H 9/04  |
|           |   |   |         |          | 361/111    |
| 2006/0232906 | A1 | * | 10/2006 | Sueoka | H02H 3/048 |
|           |   |   |         |          | 361/118    |

FOREIGN PATENT DOCUMENTS

| GB | 2538816 A | * | 11/2016 | ........... G01R 15/183 |
| JP | H0798337 A | * | 4/1995 |  |
| JP | 5175521 B2 |   | 4/2013 |  |
| WO | WO-2016054719 A1 | * | 4/2016 | ............. G01R 31/00 |

\* cited by examiner

Primary Examiner — Anh Q Tran

(57) ABSTRACT

The invention relates to a surge detector comprising a transformer comprising a primary winding arranged to receive a fraction of a surge current and a secondary winding magnetically coupled to the primary winding and arranged to output a signal representing the fraction of the surge current. The surge detector further comprises a shunt connection in parallel with the primary winding, wherein the impedance of the shunt connection is lower than the impedance of the primary winding.

13 Claims, 3 Drawing Sheets

CURRENT TRANSFORMER WITH BYPASS FOR USE IN A SURGE DETECTOR

CROSS-REFERENCE TO PRIOR APPLICATIONS

This application is the U.S. National Phase application under 35 U.S.C. § 371 of International Application No. PCT/EP2021/061953, filed on MAY 6, 2021, which claims the benefit of European Patent Application No. 20174133.7, filed on MAY 12, 2020. These applications are hereby incorporated by reference herein.

FIELD OF THE INVENTION

The invention relates to a surge detector. The invention further relates to a system comprising the surge detector.

BACKGROUND OF THE INVENTION

A surge in an input voltage or current can occur when high power loads are switched in. If for example a large electric motor is turned on, a large current spike can be generated that will flow towards other loads connected at the same grid. Such another load can be a lighting load. To protect the lighting load against such a surge, a surge suppressor can be installed that can sink the surge current and energy so that the circuitry behind the surge suppressor will be protected. A well known surge suppressor can have a varistor such as a metal-oxide varistor (MOV). Such a MOV is good at sinking the surge but deteriorates when used. In order to prevent a failure of the surge suppressor, it is helpful to know how many surges have already been absorbed by the surge suppressor so that preventive maintenance can be performed. A surge counter can be used that is designed to detect the surge spike and provide it to a counter. FIG. 1 shows an example of a known surge counter. A large current transformer is used to galvanically isolate the counter from the line through which the surge flows. The transformer needs to transform a large current at the primary side into a low current at the secondary side so that a low voltage signal can be generated. This transformer is very large and such, the surge counter requires a significant amount of volume of the total circuitry. It is therefore an objective of the invention to provide a smaller surge detector.

SUMMARY OF THE INVENTION

It is an objective of the invention to provide a surge counter that can be designed with a small transformer.

To overcome this concern, in a first aspect of the invention a surge detector is provided, wherein the surge detector comprises:
a transformer comprising:
a primary winding arranged to receive a fraction of a surge current; and
a secondary winding magnetically coupled to the primary winding and arranged to output a signal representing the fraction of the surge current;
a shunt connection in parallel with the primary winding, wherein the impedance of the shunt connection is lower than the impedance of the primary winding.

The surge detector as described in the first aspect allows a smaller transformer to be used because only a fraction of the total surge current passes through the primary side of the transformer. Since a surge current normally exceeds 1000 Amperes, only a small fraction is needed to flow through a small transformer to allow a clear signal to be created at the secondary side of the transformer. The impedance of the shunt connection can be adjusted to the impedance of the primary winding of the transformer so that a desired ratio allows a desired reduction of the transformer.

In a further example, the impedance of the shunt connection is at least 30 times smaller than the impedance of the primary winding. In this example, approximately only $\frac{1}{30}^{th}$ of the total current will flow through the transformer and hence the transformer can be significantly reduced in size.

In a further example, the impedance of the shunt connection is at a maximum 10000 times smaller than the impedance of the primary winding.

To prevent the signal at the secondary side to be too low, i.e. too weak, the impedance of the shunt connection should not be smaller than 10000 times the impedance of the primary winding.

In a further example, the resistance of the shunt connection is smaller than 50 mΩ.

With a resistance of the shunt connection being smaller than 50 mΩ, the dissipation in the shunt connection can be kept low during normal operation of the surge detector i.e. when no surge is present but when a normal operating current is present instead.

In a further example, the shunt connection consists of a printed circuit board, PCB, track.

The benefit of using a shunt that consists of a PCB track is that the resistance can be accurately determined. This allows the tolerances between different similar surge detectors to be reduced. This allows for an easier reproducibility of the surge detector in (mass) production.

In an example, the shunt connection consists of nothing more than a printed circuit board, PCB, track. The cross section and the length of the PCB track determine the total impedance of the shunt connection.

In a further example, the shunt connection is comprised in the transformer.

Providing the shunt connection in the transformer allows a dedicated transformer to be made for sensing a surge. The shunt connection can easily be integrated in the transformer as an additional trace being placed on the bobbin or via an additional wire, shorting the primary winding.

In a further example, the surge detector has a surge counter coupled to the secondary winding.

When a current has been detected on the secondary side, a surge has occurred. This signal is sent to a surge counter that counts the surges that have occurred. This allows a user of the load, such as a lamp, to monitor how many surges have occurred. The user can then determine if preventive maintenance is to be performed on the device in which the surge suppressor is present. Alternatively, only the surge suppressor can be replaced.

In a further example, surge detector comprises means for communicating with a further device.

Communication with a further device allows registration of a surge occurring. This allows a user to take notice of the amount of surges that have occurred. The user can respond accordingly by e.g. performing preventive maintenance.

In another example a system is provided comprising the surge detector according to the invention and a driver for providing a power to a load.

A device that is equipped with the surge detector according to the invention allows a small surge detector to be used and therefore the device can be made smaller.

In another example, the system comprises a surge suppressor coupled between the surge detector and the driver.

This allows the system to monitor surges that occurred and protect the driver against the occurring surges.

Alternatively, the surge suppressor can be part of a driver e.g. part of the input of the driver.

In another example, the surge suppressor comprises a varistor.

Especially varistors, such as a metal-oxide varistor (MOV), deteriorate when a surge current flows through it. The varistor is designed to drain a specific amount of surges. Therefore, it is desired to monitor the amount of surges that have occurred so that preventive maintenance can be performed.

In another example, the system also comprises the load.

In another example, the load is an LED load.

A lighting system having LED loads used in critical environments need to be extremely reliable. Examples of such lighting systems can be found in streetlight but also in emergency lighting systems. For these lighting systems it is desired to perform preventive maintenance rather than waiting until the lighting system is broken.

BRIEF DESCRIPTION OF THE DRAWINGS

Examples of the invention will now be described with reference to the accompanying drawings, in which.

DETAILED DESCRIPTION OF THE EMBODIMENTS

Figure 1:
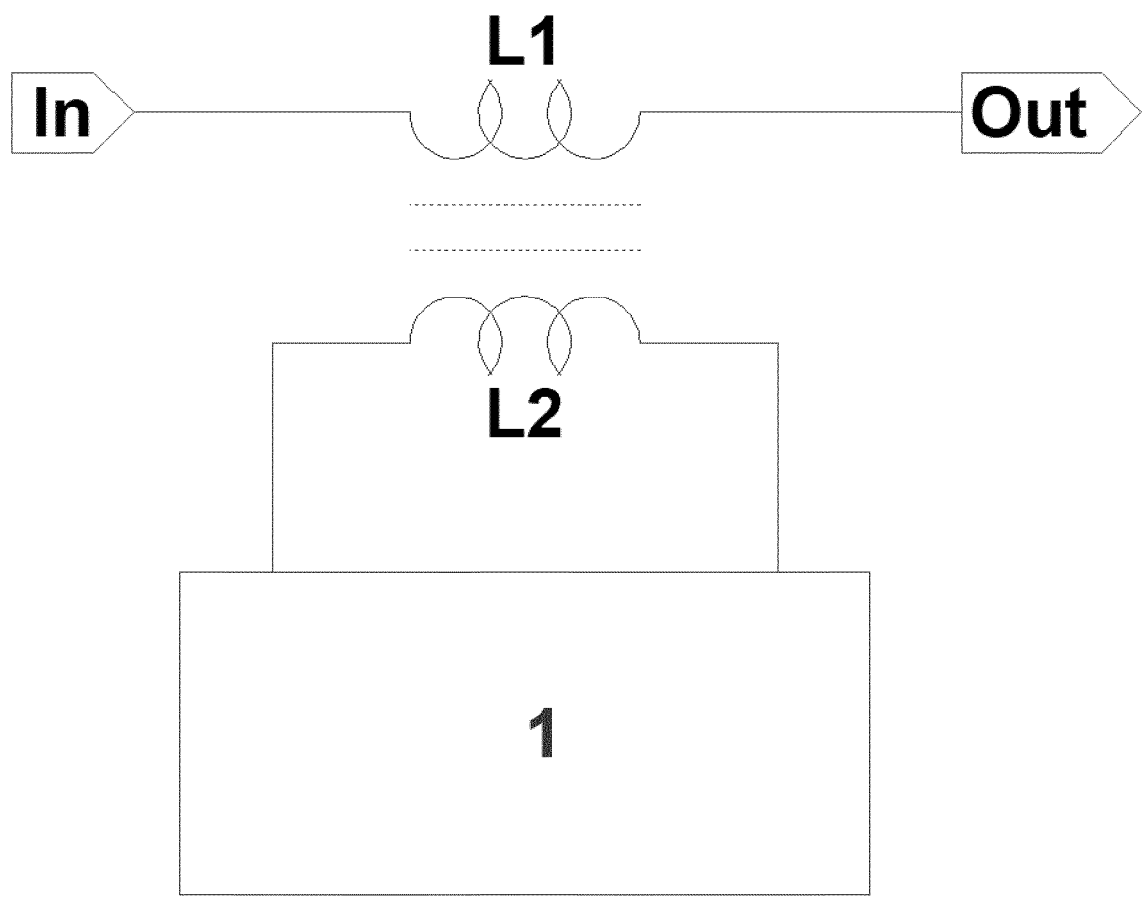
FIG. 1 shows an example of a commonly used surge detector.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

FIG. 1 shows an example of a surge detector that is commonly used. The surge detector has a transformer that has a primary side winding L1. During normal operation, a relative low current will flow the primary side winding L1. This is, for example, the current that is drawn by a device that is drawing a current from a mains power supply via the surge detector. This current is also transformed to a secondary side winding L2 that is inductively coupled to the primary winding L1. Because the current through the primary side winding L1 is relatively low, the signal generated at the secondary side winding L2 is too low to be detected by a surge counter 1. This surge counter 1 is coupled to the secondary side winding L2 and counts how many times a surge has occurred. The low current that is drawn during normal operation is too low to cause the surge counter to detect a surge. When a surge current, i.e. a relatively large current, flows through the primary winding L1, a large signal is generated at the secondary side winding 2. This large signal exceeds a threshold that defines whether a signal is considered to represent a surge occurring at the primary side winding L1. Because the transformer should only allow a large signal to be generated for the surge counter 1 when a surge occurs, the transformer needs to be able to not saturate at the surge current level but also requires a large amount of secondary windings to provide a correct signal level to be generated when a surge occurs. Because of these requirements, the transformer is very large.

Figure 2:
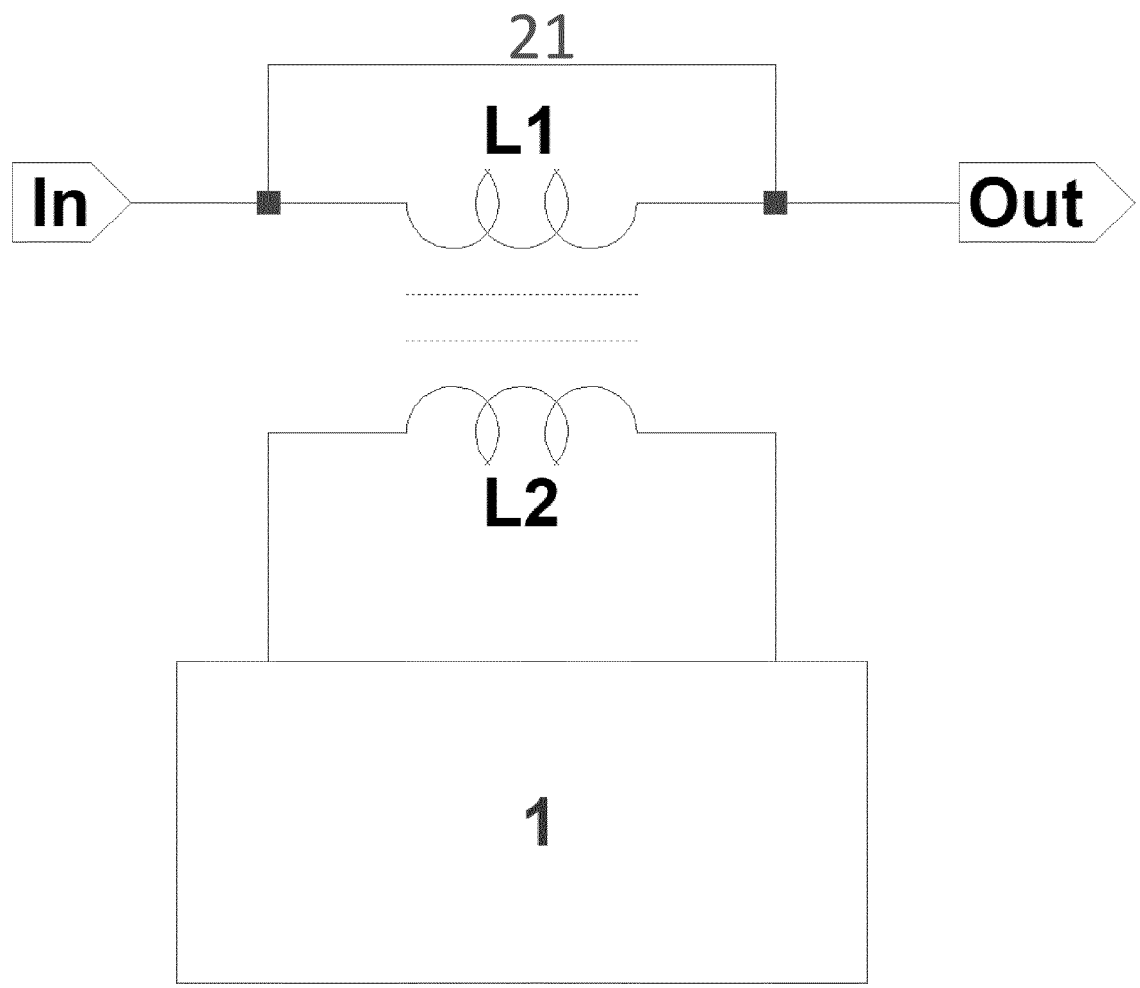
FIG. 2 shows an embodiment of the surge detector according to the invention.

FIG. 2 shows an example of a surge detector according to the invention. A current transformer is used to create a galvanic isolated signal between the current path wherein the current surge occurs and the path wherein the surge detection signal is generated. The current transformer has a primary side winding L1. In parallel to the primary winding L1, a shunt connection 21 is placed. The shunt connection 21 allows to divert a part of the current flowing through the primary winding L1 to flow through the shunt connection 21. The transformer has a secondary side winding L2 magnetically coupled to the primary side winding L1. The secondary side winding L2 can be coupled to a surge counter 1. The impedance of the shunt connection 21 is lower than the impedance of the primary winding L1. This allows the most of the current to flow through the shunt connection 21. Because most of the current flows through the shunt connection 21, only a fraction of the current will flow through the primary winding L1. This goes for the current flowing normally through the primary winding L1 but also for the surge current flowing through the primary winding L1. This results in that only a fraction of the current is needed to sense a surge current. The surge current flowing through the primary winding L1 is now smaller so the transformer can be designed to saturate at a lower current level. This significantly reduces the transformer size as the transformer core can be much smaller. The smaller the impedance of the shunt connection 21 is compared to the impedance of the primary winding, the more effect it will have on the size of the transformer. If the ratio of the impedance of the shunt connection 21 and the impedance of the primary winding L1 is too large, it can happen that the signal strength created by the secondary winding L2 is too small for the surge counter to detect a surge.

Preferably, the shunt connection 21 has an impedance that is a thirty times smaller than the impedance of the primary winding L1. For example, the impedance of the primary winding L1 at 350 kHz, which is considered to be a good representation of a frequency of the surge current, is 5Ω combined with 100 nH. The impedance of the shunt connection 21 can be 50 mΩ combined with 50 nH. The impedance of the primary winding can be greatly determined by a resistance present at the secondary side of the transformer. The resistance at the secondary side translates back to the primary side exponentially because of the turns ratio between the primary winding and the secondary winding.

A reliable and reproducible way of creating a defined impedance ratio between the primary winding and the shunt connection, over multiple surge detectors, is by creating the shunt connection 21 using a track on a PCB. The width, length and thickness of the PCB track can be easily designed such that a specific impedance is created. A standard and simple equation for determining the impedance of a track is:

$$R = \rho \cdot \frac{L}{T \cdot W}$$

R is the total resistance of the PCB track.
P is the resistivity of the material used for the PCB track. For copper this is $1.68 \times 10^{-8}$ Ωm.
L is the length of the PCB track in meters.
T is the height of the PCB track in meters.
W is the width of the PCB track in meters.
The product of T and W may form the cross section of the PCB track.

An example of an equation to determine the inductance of the PCB track can be:

$$L = 2.0 \cdot 10^{-3} \cdot \left( \ln\left(\frac{2 \cdot l}{w+t}\right) + 0.5 + 0.2235\left(\frac{w+t}{l}\right) \right)$$

L is the inductance of the PCB track in μH
l is the length of the PCB track in cm.
w is the width of the PCB track in cm.
t is the thickness of the PCB track in cm.

Figure 3:
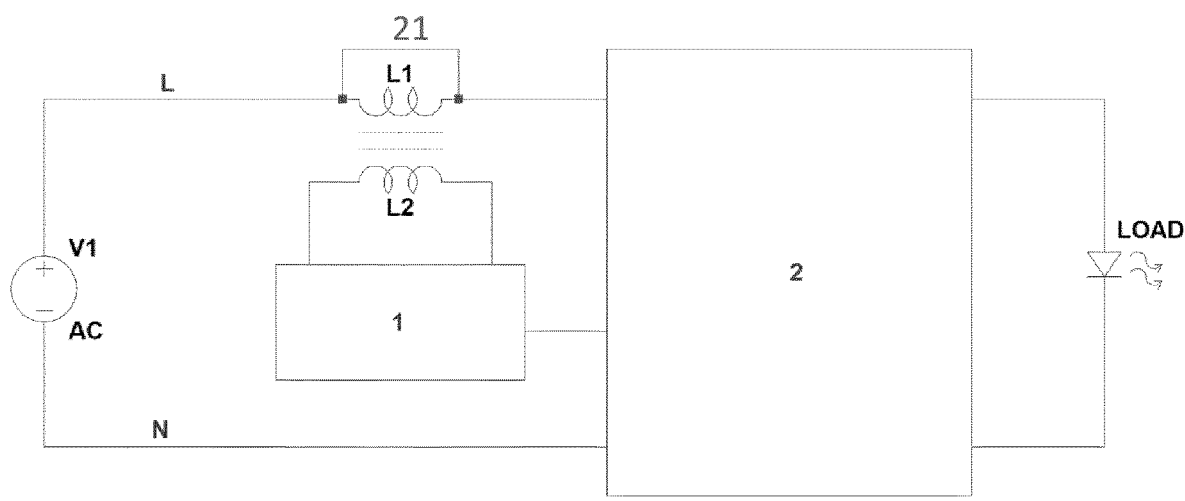
FIG. 3 shows an embodiment of a system according to the invention.

FIG. 3 shows an example of a system wherein the surge detector can be placed. The surge originates from the input voltage source V1, which is in this example the mains voltage. This surge then flows towards a driver 2 which in this example is an LED driver. The LED driver receives the mains input voltage and provides a stable output power for the load, which is in this example an LED load. A surge suppressor is placed after the surge detector. This means that the surge passes first the surge detector and is then absorbed by the surge suppressor. The surge suppressor may be part of the driver 2 or may be placed between the surge counter 1 and the driver 2. The surge suppressor comprises the surge counter 1, which detects and counts the surges that occur. The surge detector may be connected to the driver 2, which can process the counted surges. The driver 2 can for example be connected to a user interface so that a user can see how often the surge counter has detected a surge, which also indicates how often the surge suppressor has been active.

Alternatively, the surge detector can be equipped with communication means to transfer the counted surges to a separate device, which can be used for a user to read out the amount of surges that occurred.

It should be noted that the surge detector can be used in many applications such as in a stable power supply for equipment such as a personal computer or in large power applications. Preferable, the surge detector is used in a lighting system where the load is an LED load. alternatively, the load can be a LASER or a LASER diode load. A LASER load benefits from a reliable surge suppressor with a surge detector because LASERs and LASER diodes are very susceptible to current surges and break down easily.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A surge detector comprising:
a transformer comprising:
a primary winding arranged to receive a fraction of a surge current; and
a secondary winding magnetically coupled to the primary winding and arranged to output a signal representing the fraction of the surge current; and
a shunt connection in parallel with the primary winding,
wherein the impedance of the shunt connection is lower than the impedance of the primary winding,
wherein the shunt connection consists of a printed circuit board, PCB, track or wherein the shunt connection is comprised in the transformer.

2. The surge detector of claim 1, wherein the impedance of the shunt connection is at least 30 times smaller than the impedance of the primary winding.

3. The surge detector according to claim 1, wherein the impedance of the shunt connection is at a maximum 10000 times smaller than the impedance of the primary winding.

4. The surge detector according to claim 1, wherein the resistance of the shunt connection is smaller than or equal to 50 mΩ.

5. The surge detector according to claim 1 further comprising a surge counter coupled to the secondary winding.

6. The surge detector according to claim 5, wherein the surge counter is arranged to detect surge when a signal at the secondary winding exceeds a threshold.

7. The surge detector according to claim 1 further comprising means for communicating with a further device.

8. A system comprising:
the surge detector according to claim 1; and
a driver for providing a power to a load.

9. The system according to claim 8 further comprising a surge suppressor coupled between the surge detector and the driver.

10. The system according to claim 9, wherein the surge suppressor comprises a varistor.

11. The system according to claim 8, further comprising the load.

12. The system according to claim 11, wherein the load is an LED load.

13. The system according to claim 1, wherein the impedance of the shunt connection corresponds to a width, a length or thickness of the PCB.

* * * * *